United States Patent [19]

Akiyama et al.

[11] Patent Number: 4,902,636
[45] Date of Patent: Feb. 20, 1990

[54] METHOD FOR MANUFACTURING A DEPLETION TYPE DOUBLE-DIFFUSED METAL-OXIDE SEMICONDUCTOR FIELD EFFECT TRANSISTOR DEVICE

[75] Inventors: Sigeo Akiyama, Neyagawa; Masahiko Suzumura, Ibaragi; Takeshi Nobe, Hirakata, all of Japan

[73] Assignee: Matsushita Electric Works, Ltd., Osaka, Japan

[21] Appl. No.: 294,787

[22] Filed: Jan. 9, 1989

[30] Foreign Application Priority Data

Jan. 18, 1988 [JP] Japan .................................. 63-8993

[51] Int. Cl.$^4$ .................... H01L 21/265; H01L 21/31
[52] U.S. Cl. ...................................... 437/45; 437/29; 437/40; 148/DIG. 126
[58] Field of Search ..................... 437/45, 27, 28, 29, 437/30, 40; 357/23.4, 23.12, 22; 148/DIG. 126

[56] References Cited

U.S. PATENT DOCUMENTS

| | | | |
|---|---|---|---|
| Re. 32,800 | 12/1988 | Ham et al. | 437/27 |
| 3,461,360 | 8/1969 | Barson et al. | 357/23.4 |
| 3,484,865 | 12/1969 | Nienhuis | 357/23.1 |
| 3,667,115 | 6/1972 | Barson et al. | 437/29 |
| 4,280,855 | 7/1981 | Bertim et al. | 437/45 |
| 4,329,186 | 5/1982 | Kotecha et al. | 437/45 |
| 4,376,285 | 3/1983 | Leonberger et al. | 357/15 |
| 4,376,286 | 8/1983 | Lidow et al. | 357/23 |
| 4,532,534 | 7/1985 | Ford et al. | 357/23.4 |
| 4,626,293 | 12/1986 | Schols | 357/23.4 |
| 4,642,666 | 2/1987 | Lidow et al. | 357/23.4 |
| 4,705,759 | 11/1987 | Lidow et al. | 437/29 |

FOREIGN PATENT DOCUMENTS

| | | | |
|---|---|---|---|
| 0050661 | 12/1980 | Japan | 357/23.4 |
| 0042164 | 5/1982 | Japan | 357/23.4 |
| 0231860 | 12/1984 | Japan . | |
| 0150769 | 7/1987 | Japan | 357/23.4 |
| 82/02981 | 9/1982 | World Int. Prop. O. . | |

OTHER PUBLICATIONS

D. Ueda et al., "AWCW Channel-Doping Technique for High Voltage Depletion-Mode Power MOS-FETS", IEEE Trans. on Devices, vol. EDL.7, No. 5, May 76, pp. 311-313.
Alexander et al., "Depletion-Mode MOSFETS Open a Channel Into Power Switching", Electronic Design, Jun. 28, 1984, pp. 281-283.
M. D. Pocha et al., "Tradeoff Between Threshold VOltage and Breakdown in High Voltage Double-Diffused MOS Transistors", IEEE Trans. on Elect. Devices, vol. ED-5, No. 11, Nov. 78, pp. 1325-1327.

Primary Examiner—Brian E. Hearn
Assistant Examiner—T. Thomas
Attorney, Agent, or Firm—Burns, Doane, Swecker & Mathis

[57] ABSTRACT

A method for manufacturing double-diffused metal-oxide-semiconductor field effect transistor (DMOSFET) device is to form an insulating layer having an opening in top surface on a semiconductor wafer, channel regions and well regions and source regions through two stage diffusions of impurity materials respectively of a different conductivity type from and the same conductivity type as the wafer and carried out through the opening, and further gate, source and drain electrodes are formed after masks provided on a surface area where the drain regions and the source electrode regions that are to be connected to the well regions and source regions and a further ion-implantation of an impurity material of the same conductivity type as the wafer into the channel regions, with the threshold voltage controlled to achieve a depletion type. The channel regions are relatively lower in the carrier concentration than the other parts in the well regions to achieve a high breakdown voltage notwithstanding that the device is of the depletion type.

2 Claims, 2 Drawing Sheets

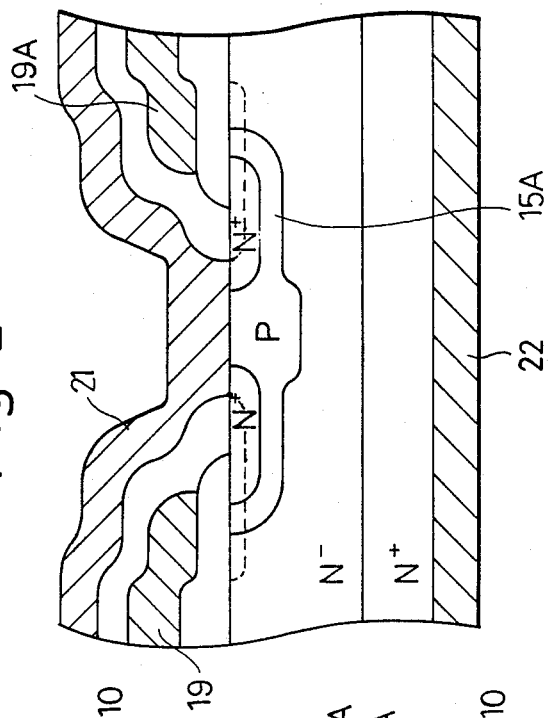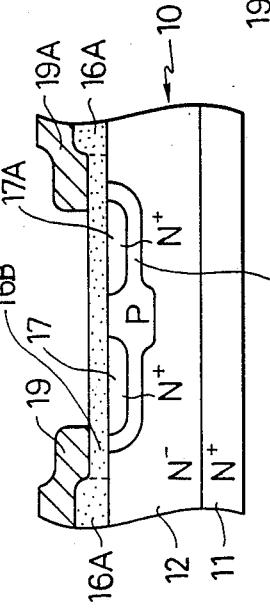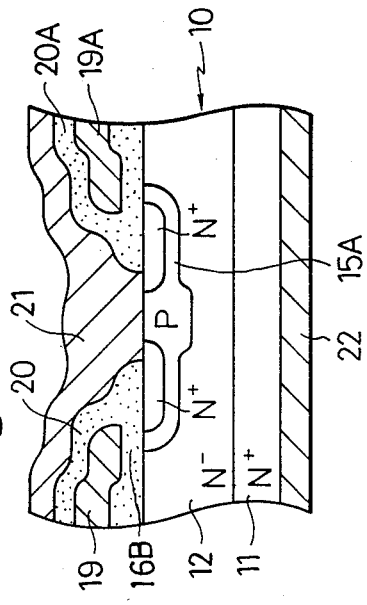

METHOD FOR MANUFACTURING A DEPLETION TYPE DOUBLE-DIFFUSED METAL-OXIDE SEMICONDUCTOR FIELD EFFECT TRANSISTOR DEVICE

BACKGROUND OF THE INVENTION

This invention relates to a method for manufacturing a power semiconductor device as well as the device thereby manufactured and, more particularly, to a method for manufacturing a power double-diffused metal-oxide semiconductor field effect transistor device and to such semiconductor device.

The semiconductor device, in particular, the double-diffused metal-oxide semiconductor field effect transistor (which shall be hereinafter referred to as "DMOSFET") can be effectively utilized where the transistor is required to be high in the durability, switching speed and noise resisting property.

Further, the DMOSFET is advantageous in that, because of its structure, the current density is high and the ON resistance is low as compared with MOSFET which is not of the double-diffused type. On the other hand, the DMOSFET has been enhancement type, that is, normally-off type, and it has been demanded that, a power MOSFET of depletion type, that is, normally-on type is provided for a use under certain conditions.

DISCLOSURE OF PRIOR ART

Generally, the DMOSFET is enumerated as one of power MOSFET. In, for example, U.S. Pat. No. 3,461,360 to F. Barson et al, a basic structure of the DMOSFET, wherein a cup-shaped region of one conductivity type and formed between two opposite conductivity type regions is utilized. In the case of this Barson et al, the cup-shaped one conductivity type region is formed to oppose an opening made in an insulating layer on a surface of a semiconductor wafer. Here, it is made possible to realize a vertical type DMOSFET by forming either a drain or a source electrode as shown in, for example, U.S. Pat. No. 3,484,865 to R. J. Nienhuis on reverse surface of the wafer as in the above. For manufacturing method of the vertical type DMOSFET, there have been disclosed various methods for manufacturing the relevant transistors of the enhancement type (normally-off type) in, for example, U.S. Pat. Nos. 4,376,286, 4,642,666 and 4,705,759 to A. Lidow et al.

In U.S. Pat. No. 3,667,115 to F. Barson et al, on the other hand, there has been disclosed a method for forming a DMOSFET of the depletion type (normally-on type), in which method a cup-shaped region of first conductivity type enclosed by two regions of second conductivity type, by forming an insulating layer on a surface of a semiconductor wafer of the second conductivity type, forming an opening in this insulating layer, and diffusing through this opening into the wafer an impurity of the first conductivity type and an impurity of the second conductivity type, and a surface of this cup-shaped first conductivity type region is made to be a channel region. Thereafter, a surface layer of the second conductivity type semiconductor wafer is oxidized to have the impurity material of second conductivity type piled up at the surface of the wafer, and the impurity material of first conductivity type is absorbed in the oxidized surface layer, upon which the channel region of normally ON type is to be formed between the two second conductivity type regions. In forming the DMOSFET, such redistribution of the impurities by the oxidation as in the above is largely dependent on the atmosphere and oxidizing time for forming the oxidized layer and is variable also depending on the concentration and type of the impurities. There arises, therefore, a drawback in carrying out the method while controlling accurately the threshold voltage of the DMOSFET. Further, this known method has been also defective in that the process reproducibility is low and the process freedom is limited.

In U.S. Pat. No. 4,626,293 to G. Schols, further, there has been disclosed a process for manufacturing a DMOSFET using a polysilicon gate material as a mask, according to which a surface of a semiconductor wafer of first conductivity type is covered with an oxidized layer, and a polysilicon is formed on this oxidized layer. An opening is thereafter made through the polysilicon and the oxidized layer, an impurity material of second conductivity type is injected through the opening to carry out a first diffusion. An impurity material of first conductivity type is injected also through the opening to carry out a second diffusion into the wafer, so that a channel region of second conductivity type will be formed under the polysilicon. When the depletion type DMOSFET is to be manufactured according to this process, injection amount of the impurity material of second conductivity type is decreased, and the carrier concentration at the surface of the second conductivity zone forming the channel region is made lower so as to lower the threshold voltage. Since this threshold voltage is determined by the injection amount of the impurity material of second conductivity type, it will be possible that the process reproducibility and the freedom will be compensated for.

With the foregoing arrangements, however, not only the surface carrier concentration of the second conductivity zone forming the channel region but also the carrier concentration of the entire second conductivity zone will be lowered, so as to cause a problem to arise in that a so-called "punch through" is likely to occur between the source and the drain so as to lower the breakdown voltage characteristics.

FIELD OF ART

A primary object of the present invention is, therefore, to provide a method for manufacturing a depletion type DMOSFET which is easy to control and set the threshold voltage, high in the process reproducibility and freedom, and shows high breakdown voltage characteristics.

According to the present invention, the above object of the invention can be attained by providing a method for manufacturing a DMOSFET device by forming an insulating layer on a silicon wafer, forming at least one opening in top surface of the insulating layer, carrying out a first diffusion of an impurity material of a different conductivity type from the semiconductor wafer through the opening and covering said opening with further insulating layer, forming a further opening in the insulating layer at its part outerwardly adjacent the first formed opening, carrying out a second diffusion of the impurity material that is different from the conductivity type of the wafer through the further opening, sequentially carrying out a further diffusion of an impurity material of the same conductivity type as the wafer through the further opening to thereby form in the wafer channel regions and well regions and source regions of the different conductivity type from the wafer, and forming gate electrodes with a gate oxide layer provided on top surface of the channel regions and forming source and drain electrodes on the wafer, characterized in that after removing the insulating layer at a zone adjacent the well regions, masks are provided on top surface of a region of the source electrodes connected to the well regions and source regions and an ion-implantation of the impurity of the same conductivity type as the wafer is carried out only in a relatively small zone including the channel regions.

With the above method, it is made possible to render the carrier concentration in surface area of the zone of a conductivity forming the channel regions to be relatively low for controlling the threshold voltage to be low, while rendering the carrier concentration in other area to be high for reducing the punch-through occurrence, to allow the device to be high in the breakdown voltage In the case of, for example, N-channel DMOSFET, it is made possible to perform a low voltage driving with such a low threshold voltage as $-1.5$ to $-3.5$ V, while it is made possible to obtain, in particular, a depletion type DMOSFET with the breakdown voltage and current density as the DMOSFET characteristics maintained to be high.

Other objects and advantages of the present invention shall be made clear in following description of the invention detailed with reference to a preferred embodiment shown in accompanying drawings

BRIEF EXPLANATION OF THE DRAWINGS

FIGS. 1A through 1H are diagrams showing the sequence of manufacturing steps of the depletion type DMOSFET according to the present invention; and FIG. 2 is a cross-sectional view at a main part of the depletion type DMOSFET obtained through the steps of FIG. 1.

It should be appreciated that, while the present invention shall be explained with reference to the embodiment shown in the accompanying drawings, the intention is not to limit the invention only to this embodiment but rather to include all modifications, alterations and equivalent arrangements possible within the scope of appended claims.

DISCLOSURE OF PREFERRED EMBODIMENT

Referring to FIGS. 1A through 1H, there is shown a method for manufacturing an N-channel DMOSFET of the depletion type, in which the breakdown voltage characteristics of the DMOSFET device shall be referred to later, with an assumption that the characteristics will reach 400 V.

Figure 1A:
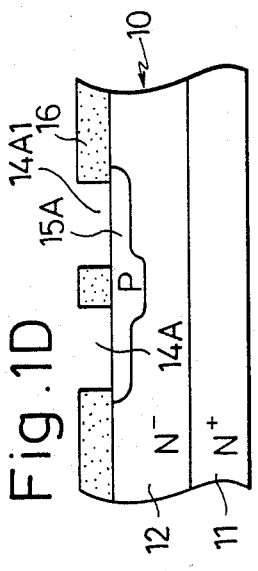

First, as shown in FIG. 1A, a semiconductor wafer 10 forming a drain region of the device is prepared. Reverse side of this semiconductor wafer 10 is an N+ type zone 11 with a doping at a high impurity concentration, while top surface side is an N− type zone 12 with a doping at a relatively low impurity concentration. The concentration and thickness of this N− type zone 12 are to be properly selected in accordance with the breakdown voltage required for the DMOSFET while the impurity concentration is selected to be about $2 \times 10^{14}$ cm$^{-3}$ and the thickness to be about 40 $\mu$m when the breakdown voltage is 400 V.

Figure 1B:
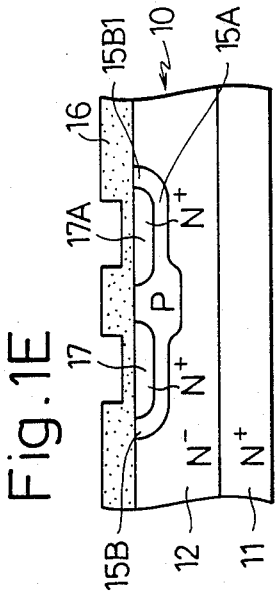

Next, as shown in FIG. 1B, such insulating layer 13 of SiO$_2$ or the like that will act as mask is formed in surface zone of the semiconductor wafer 10. When an oxide layer is formed as the insulating layer 13, its thickness should preferably be more than 5000 Å. Further, a known photolithography is carried out with respect to the surface of this insulating layer 13 to form an opening 14, and a diffusion of a P-type impurity with boron employed is carried out through this opening 14 into the zone 12 to form a P-type diffusion region 15. When the impurity injection is carried out by means of an ion-implantation, a dose amount is made to be about $6 \times 10^{14}$ cm$^{-2}$. And covering the opening 14 with oxide layers.

Figure 1C:
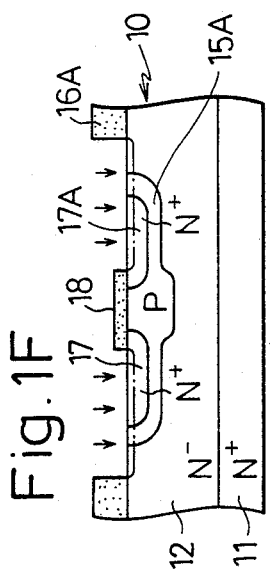
Figure 1D:
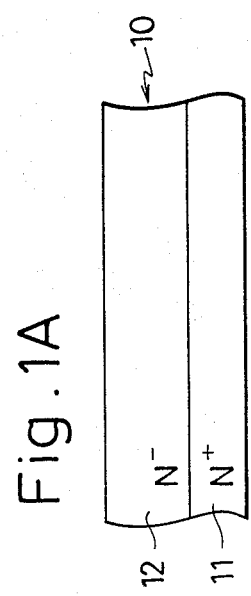

Next, as shown in FIG. 1C, an oxide layer 16 in which further openings 14A and 14A1 for double diffusion are formed is provided on the zone 12 for forming channel regions, P-type impurity with boron is injected and diffused through these further openings 14A and 14A1 into the zone 12, the P-type diffusion region 15 is thereby expanded along the top surface of the wafer 10, and a well region 15A is thereby formed, as seen in FIG. 1D. In the event of the impurity injection for forming the well region 15A is carried out by means of the ion-implantation, its dose amount is made to be about $7.5 \times 10^{13}$ cm$^{-2}$.

Figure 1E:
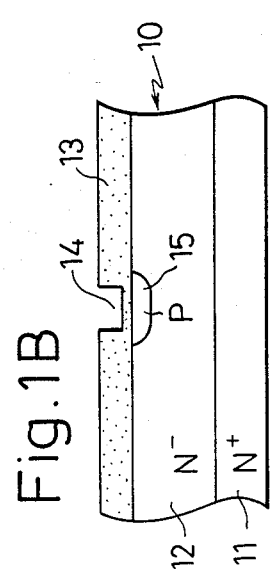

Further, as shown in FIG. 1E, an oxide layer 16 is used as a mask of injecting and diffusing an N-type impurity with phosphorus into surface zones of the P-type well region 15A, and N-type diffusion zones 17 and 17A (N+ zones) are formed as source regions. Outside the P-type well region 15A, there is present the N− zone 12 as a part of the drain region, so that channel regions 15B and 15B1 will be formed in surface zones of the well region 15A disposed between the both N-type zones 12 and 17, 17A. It will be appreciated in this case that the N-type diffusion zones 17 and 17A are formed inside the well region 15A.

Figure 1F:
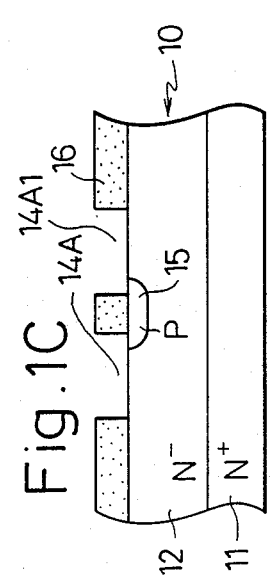

As shown in FIG. 1F, next, the oxide layer 16 is partly removed by means of the photolithography at a part positioned on the P-type well region 15A and its peripheral zone extending at least 5 $\mu$m from outer peripheral edges of the further openings 14A and 14A1, so as to expose top surfaces of the P-type well region 15A and N-type zones 17 and 17A. Thereafter, a photoresist 18 is provided so as to cover a central area as in the drawing of the well region 15A, and an ion-implantation of such N-type impurity as phosphorus P, arsenic As or the like is carried out with the now provided photoresist 18 and remaining parts 16A of the oxide layer 16, to areas shown by single-dot chain lines While the amount of the ion-implantation may be properly selected in accordance with surface concentration of the channel regions 15B and 15B1 or the threshold voltage required for the DMOSFET, it is preferable to set the amount in the case of phosphorus to be about 5 to $25 \times 10^{11}$ cm$^{-2}$. As the N-type impurity is thus ion-implanted into the surface areas of the P-type well region 15A including the channel regions 15B and 15B1, a reverse conductivity impurity is caused to be increased in the channel regions 15B and 15B1, the carrier concentration in the channel regions 15B and 15B1 is decreased by an increased amount of the reverse conductivity impurity, and a normally-on channel is formed. In this case, the N− zone 12 as the drain region is reliably protected by the remaining parts 16A of the oxide layer 16 while the central area of the well region 15A is protected by the photoresist 18 so as not to be influenced by the ion-implantation. In practice, the ion-implantation of the N-type impurity is limited only to the surface area, and the impurity diffusion treatment as a main part of heat treatment has already been completed, so that the N-type impurity will never be diffused exceedingly over a desired range but as retained to be at the channel regions 15B and 15B1, whereby the carrier concentration at other area of the channel regions 15B and 15B1 in the P-type well region 15A is not caused to vary. Further, as the surface area of the N⁻ zone 12 forming part of the drain region below the remaining parts 16A of the oxide layer 16 and the central area of the well region 15A below the photoresist 18 are not affected by the ion-implantation, any variation in the breakdown voltage value of the DMOSFET or any occurrence in MOS diode of parasitic series resistance component will not take place. Accordingly, it becomes possible to freely adjust the threshold voltage in a considerably wide range by means of the carrier concentration of the channel regions 15B and 15B1 with the injection amount of the N-type impurity optionally selected.

As shown in FIG. 1G, further, the photoresist 18 is removed, thereby exposed diffusion region 15 is covered by a gate oxide layer 16B formed through any known gate oxide-layer forming process, and gate electrodes 19 and 19A are formed on the remaining oxide layer parts 16A and at least partly on the gate oxide layer 16B disposed on the channel regions 15B and 15B1. In the present instance, the remaining oxide layer parts 16A is made to be about 8000 Å and the gate oxide layer 16B to be about 1000 Å, while the gate electrodes 19 and 19A are made to be about 5000 Å thick by means of a polysilicon doped to be N-type.

Finally, as shown in FIG. 1H, insulating layers 20 and 20A are formed on the gate electrodes 19 and 19A, a part of the gate oxide layer 16B positioned on the central area of the diffusion region 15 is removed, a source electrode 21 is formed on the central area of the diffusion region 15, and a drain electrode 22 is formed on reverse surface on the side of the N⁺ zone 11 of the semiconductor wafer 10, whereby such depletion type DMOSFET as shown in FIG. 2 as magnified is completed. In this DMOSFET, the remaining oxide layer parts 16A disposed on the surface of the N⁻ zone 12 forming a part of the drain region are formed to be thicker than the gate oxide layer 16B, so that any parasitic capacity between the gate and drain, that is, feedback capacity can be made small. For the gate oxide layer 16B on the channel regions 15B and 15B1, its thickness should preferably not exceed 1000 Å so that the gate action by means of the gate electrodes 19 and 19A will be realized with the gate oxide layer 16B interposed, while other parts of the layer 16B may be formed thicker. It should be clear that, in FIG. 2, zones defined by dotted lines are the ion-implanted zones.

While the foregoing embodiment refers to the DMOSFET of a vertical type as an example, it should be readily appreciated that the present invention is similarly applicable to any DMOSFET of lateral type, or of a conductivity modulation type, and can be used not only in the transistor but also in thyristor. Further, the semiconductor device may be of a different structure in which the N-type and P-type zones are respectively reversed.

What is claimed is:

1. A method for manufacturing a depletion type DMOSFET device, comprising the steps of forming a first insulating layer on a silicon wafer; forming at least a first opening in a top surface of said insulating layer; carrying out a first diffusion of an impurity material of a different conductivity type from said wafer through said first opening; covering said first opening with a second insulating layer; forming a second opening in the insulating layer with a part outwardly adjacent said first opening; carrying out a second diffusion of the impurity material that is different from the conductivity type of the wafer through said second opening; sequentially carrying out a third diffusion of an impurity material of the same conductivity type as the wafer though a third opening to form in the wafer well and source regions including channel region of the different conductivity type from the wafer; removing the insulating layer on said well and source regions including the insulating layer on a part of the wafer outwardly adjacent the well region by at least 5 μm from outer peripheral edges of said third opening; providing a mask on an area including said central part of the well region and an adjacent part of the source region on which said source electrode is to be formed; carrying out an ion-implantation of an impurity of the same conductivity type as the wafer in said well and source regions including said channel region and said wafer part adjacent the well region from which the insulating layer has been removed, except for said area on which said mask is provided; removing said mask; forming gate electrodes with a gate oxide layer on said channel region of said well region; and forming a source electrode on a central part of said well region and adjacent parts of said source regions and a drain electrode on reverse side of the wafer.

2. A method according to claim 1, wherein said silicon wafer is made to be of N-type and of an impurity concentration of about $2 \times 10^{14}$ cm$^{-3}$, said first impurity ion-implantation is carried out with boron in a dose amount of about $6 \times 10^{14}$ cm$^{-2}$, said second impurity injecting diffusion is carried out in a dose amount of about $7.5 \times 10^{13}$ cm$^{-2}$, said impurity injection with respect to said relatively small zone including said channel regions is carried out with phosphorus in a dose amount of about 5 to $25 \times 10^{11}$ cm$^{-2}$, and said gate oxide layer is made about 1000 Å thick.

* * * * *